United States Patent
Zhang

(10) Patent No.: US 9,209,025 B2
(45) Date of Patent: Dec. 8, 2015

(54) LOW TEMPERATURE POLY-SILICON THIN FILM, METHOD FOR MAKING THE THIN FILM, AND TRANSISTOR MADE FROM THE THIN FILM

(71) Applicant: Shenzhen China Star Optoelectronics Technology Co., Ltd., Shenzhen, Guangdong (CN)

(72) Inventor: Longxian Zhang, Shenzhen (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 29 days.

(21) Appl. No.: 14/234,985

(22) PCT Filed: Dec. 30, 2013

(86) PCT No.: PCT/CN2013/090858
§ 371 (c)(1),
(2) Date: Jan. 24, 2014

(87) PCT Pub. No.: WO2015/096174
PCT Pub. Date: Jul. 2, 2015

(65) Prior Publication Data
US 2015/0194310 A1    Jul. 9, 2015

(30) Foreign Application Priority Data
Dec. 25, 2013 (CN) .......................... 2013 1 0728614

(51) Int. Cl.
H01L 21/02 (2006.01)
H01L 29/786 (2006.01)

(52) U.S. Cl.
CPC .... *H01L 21/02678* (2013.01); *H01L 21/02532* (2013.01); *H01L 21/02686* (2013.01); *H01L 29/78672* (2013.01)

(58) Field of Classification Search
CPC .................................................. H01L 29/66757
USPC ........................................ 257/66, 75; 438/479
See application file for complete search history.

(56) References Cited

U.S. PATENT DOCUMENTS

2007/0117286 A1* 5/2007 Jang et al. ...................... 438/151
2008/0024402 A1* 1/2008 Nishikawa et al. .............. 345/82
2009/0316028 A1* 12/2009 Liu ................................ 348/294

* cited by examiner

*Primary Examiner* — Mamadou Diallo
(74) *Attorney, Agent, or Firm* — Andrew C. Cheng

(57) ABSTRACT

The present invention provides a method for making low temperature poly-silicon thin film, including the step of growing amorphous silicon layer, the step of firstly growing a layer of silicon oxide over the amorphous silicon layer; then forming a plurality of concave surfaces across the silicon oxide layer, wherein the concave surfaces will reflect light beams vertically projected toward the silicon oxide; and finally, the step of projecting excimer laser beam toward the amorphous silicon layer through the silicon oxide layer to transform the amorphous silicon layer into the low temperature poly-silicon thin film. The present invention further provides a low temperature poly-silicon thin film made from the method described above, and also a low temperature poly-silicon transistor. When the excimer laser annealing process is implemented to make the low temperature poly-silicon thin film, the starting point and direction of the recrystallization can be controlled so as to attain larger grain size.

14 Claims, 3 Drawing Sheets

LOW TEMPERATURE POLY-SILICON THIN FILM, METHOD FOR MAKING THE THIN FILM, AND TRANSISTOR MADE FROM THE THIN FILM

FIELD OF THE INVENTION

The present invention relates to the field of liquid crystal display, and more particularly, to a low temperature poly-silicon thin film, method for making the thin film. And also relates to a low temperature poly-silicon thin layer transistor.

DESCRIPTION OF PRIOR ARTS

The liquid crystal displaying device is featured with slim and compact displaying equipment. It generally configures with a plurality of colorful or black-and-white pixels arranged in from of a light source or reflecting surface. It features lower energy exhaustion, high displaying quality, compact size, and light-weight, as a result, it has been widely applied and becomes the main stream of the displaying device. Currently, the liquid crystal display is made mainly by thin film transistor (TFT). With the development of the display panel, providing a liquid crystal display of high resolution and low energy consumption for liquid crystal display has been continuously requested from the market. Amorphous silicon has a low electron migrating rate. Since the low temperature poly-silicon can be grown under low temperature, and it features a high electron migrating rate and can be readily implemented into the C-MOS circuit. As a result, it has been widely applied into the display panel with high resolution and low energy consumption.

Currently, methods for making low-temperature poly-silicon include solid-phase crystallization (Solid Phase Crystallization, SPC), metal-induced crystallization (Metal Induced Crystallization, MIC), and excimer laser annealing (Excimer Laser Annealer, ELA), and in which the excimer laser annealing process is the most widely used methods. Excimer laser annealing process is to use the excimer laser beam on the amorphous silicon thin film substrate, and has the amorphous silicon thin film be irradiated for a short period of time. As a result, the amorphous silicon is melted under high temperature and then transformed into poly-silicon crystallization.

The grain size of the low-temperature poly-silicon has a significant impact on the electrical properties of poly-silicon. During the excimer laser annealing process, the amorphous silicon becomes completely melted by the high temperature (Nearly Completely Melts) state, and then recrystallized to form poly-silicon. When the recrystallization occurs, it will crystallize along a direction pointed from low energy to high energy, crystallization from low temperature to high temperature. Currently, the excimer laser beam is uniformly projected onto the amorphous silicon thin film, creating a substantial equilibrium of the temperature across the amorphous silicon thin film layer. As a result of the equilibrium of temperature across of the thin film, the starting point and direction of the recrystallization is messy, resulting the crystallization has small grainsize and multiple grain boundaries. Accordingly, this will affect the migrating rate of the electrons within the poly-silicon.

SUMMARY OF THE INVENTION

In light of the insufficiency of the current technology, the present invention provides a method for making low temperature poly-silicon thin film. When the excimer laser annealing process is implemented to make the low temperature poly-silicon thin film, the starting point and direction of the recrystallization can be controlled so as to attain larger grain size.

In order to achieve the object set forth above, the present invention further provides the following technical solution.

A method for making low temperature poly-silicon thin film, including the step of growing amorphous silicon layer, the step of firstly growing a layer of silicon oxide over the amorphous silicon layer; then forming a plurality of concave surfaces across the silicon oxide layer, wherein the concave surfaces will reflect light beams vertically projected toward the silicon oxide; and finally, the step of projecting excimer laser beam toward the amorphous silicon layer through the silicon oxide layer to transform the amorphous silicon layer into the low temperature poly-silicon thin film.

Wherein the method substantially includes the following steps:

(a) providing a substrate on which a buffer layer is arranged;

(b) creating the amorphous silicon layer on the buffer layer;

(c) creating the silicon oxide on the amorphous layer, and further creating the plurality of concave surfaces by etching process; and (d) projecting excimer laser beam toward the amorphous silicon layer through the silicon oxide layer to transform the amorphous silicon layer into the low temperature poly-silicon thin film.

Wherein further includes the step of removing the silicon oxide layer after the low temperature poly-silicon layer is formed.

Wherein the concave surfaces are arranged in array over the silicon oxide layer.

Wherein a distance between two adjacent concave surfaces is 300~600 micrometers.

Wherein each of the concave surfaces includes a circular circumference with a diameter of 10~20 micrometers and a depth of 150~200 nano meters.

Wherein with the step (b), the amorphous silicon layer is undergoing a process of high temperature hydrogen embrittlement relief after the amorphous silicon layer is created.

Wherein the buffer layer is made from silicon oxide.

The present invention further provides a low temperature poly-silicon thin film which is made by the method disclosed above.

The present invention further provides a low temperature poly-silicon thin film transistor, which includes a substrate;

a semiconductor layer deposited onto the substrate and which is configured by low temperature poly-silicon thin film, wherein the semiconductor includes a source, a drain, and a channel located between the source and drain;

a gate insulative layer and gate being formed onto the semiconductor, wherein the insulative layer is used to isolate the gate and the semiconductor, and the gate is located in a position corresponding to the channel;

a dielectric layer disposed onto the gate insulative layer and the gate, wherein the dielectric layer includes a first hole in which a source electrode is interconnected with the source, and a second hole in which a drain electrode is interconnected with the drain; wherein The present invention can be concluded with the following advantages.

The method for making low temperature poly-silicon thin film provided by the present invention is to grow a silicon oxide layer having a plurality of concave surfaces; then projecting excimer laser beam toward it to recrystallize the amorphous silicon layer, the excimer laser beam is reflected across the concave surfaces area. As a result, the amorphous silicon layer under the concave surfaces of the silicon oxide layer has a comparable low temperature, and therefore creating a low temperature area. While to the area other than the concave surfaces, the excimer laser beam passes directly through the silicon oxide layer so as to create a high temperature area on the amorphous silicon layer. The poly-silicon crystallization grows from low energy to high energy, creating crystallization from low temperature to high temperature. Accordingly, the low temperature area becomes a starting point of crystallization, and then expands and grows toward the high temperature area. By this arrangement, a low temperature poly-silicon layer with larger amorphous silicon grain size, and controllable direction can be attained. In addition, the transistor made from the low temperature poly-silicon layer features high electron migrating rate as well as excellent characteristic.

DETAILED DESCRIPTION OF PREFERRED EMBODIMENT

As described above, it is the object of the present invention to resolve the random direction and starting point of the recrystallization of the poly-silicon thin film through excimer laser annealing process which results in smaller grain size of the crystallization. In addition, it also inherits a problem of multiple boundaries between the grains. Accordingly, the present invention provides a method for making low temperature poly-silicon thin film provided by the present invention is to grow a silicon oxide layer having a plurality of concave surfaces; then projecting excimer laser beam toward it to recrystallize the amorphous silicon layer, the excimer laser beam is reflected across the concave surfaces area. As a result, the amorphous silicon layer under the concave surfaces of the silicon oxide layer has a comparable low temperature, and therefore creating a low temperature area. While to the area other than the concave surfaces, the excimer laser beam passes directly through the silicon oxide layer so as to create a high temperature area on the amorphous silicon layer. The poly-silicon crystallization grows from low energy to high energy, creating crystallization from low temperature to high temperature in which the excimer laser beam does not reflect. Accordingly, the low temperature area becomes a starting point of crystallization, and then expands and grows toward the high temperature area. By this arrangement, a low temperature poly-silicon layer with larger amorphous silicon grain size, and controllable direction can be attained.

Detailed description will be given herebelow with the accompanied drawings.

Figure 1A:
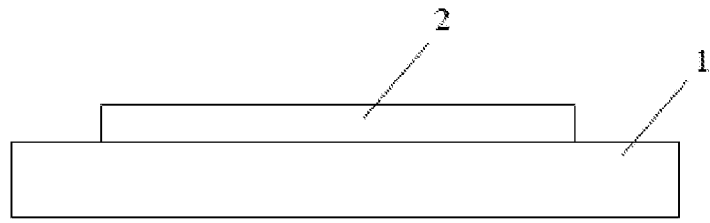
FIG. 1 is a flow chart diagram illustrating a method of making a low temperature poly-silicon thin film according to one of a preferred embodiment of the present invention.
Figure 1B:
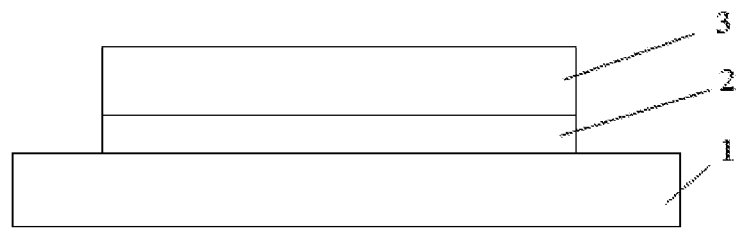
Figure 1C:
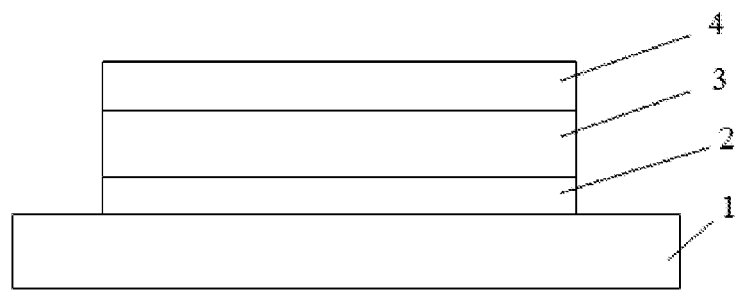
Figure 1D:
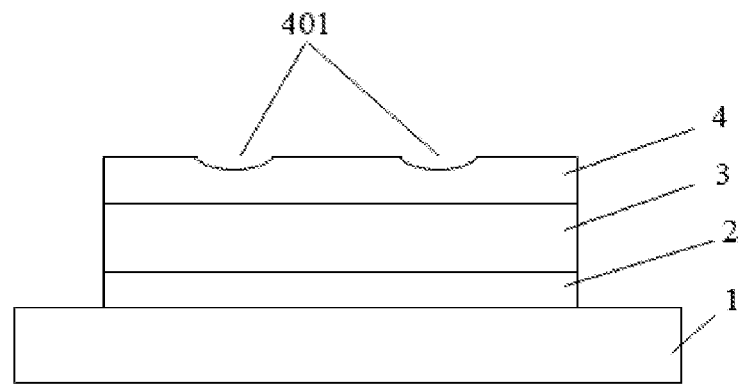
Figure 1E:
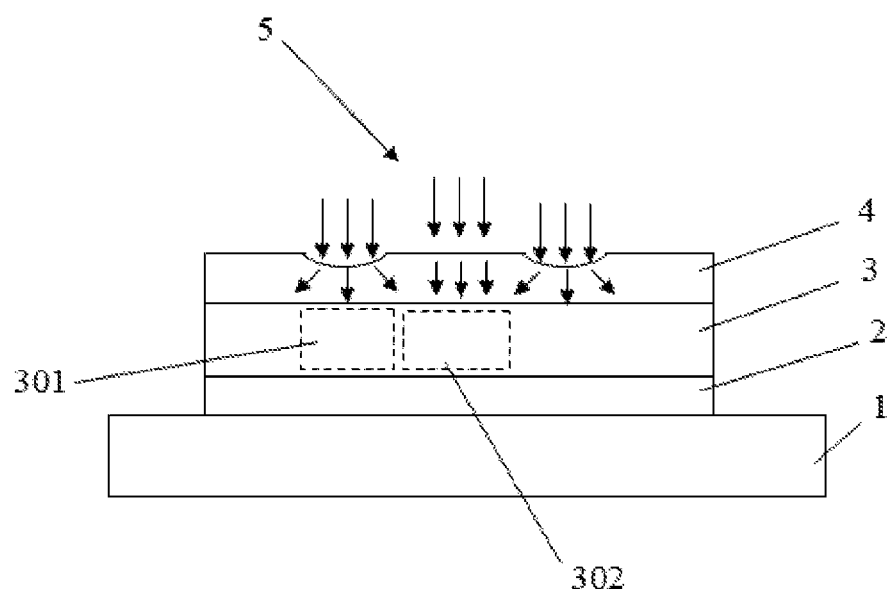
Figure 2:
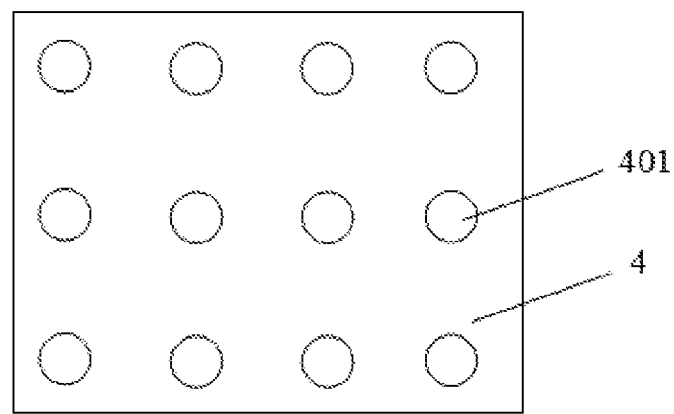
FIG. 2 is a top view of a typical concave surface disposed on a silicon oxide layer in accordance with the present invention.
Figure 3:
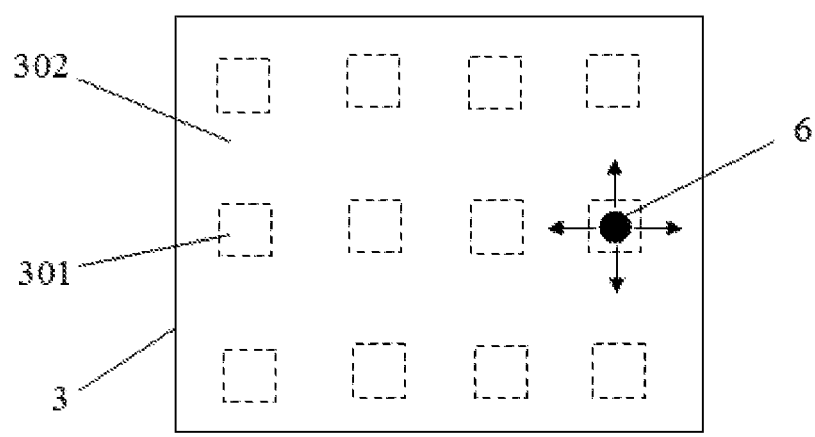
FIG. 3 is an illustrational view showing the growth of recrystallization in accordance with the present invention.

Referring to FIG. 1-3, in which FIG. 1 is a flow chart diagram illustrating a method of making a low temperature poly-silicon thin film according to one of a preferred embodiment of the present invention. The method includes the steps of:

(a) As shown in FIG. 1a, firstly a substrate 1 is provided and on which a buffer layer 2 is arranged. The substrate 1 is a glass substrate, and the buffer layer 2 is a silicon oxide.

(b) As shown in FIG. 1b, the amorphous silicon layer 3 is created on the buffer layer 2. A high temperature hydrogen embrittlement relief process is conducted toward the amorphous silicon layer 3.

(c) As shown in FIGS. 1c and 1d, a silicon oxide layer 4 is created on the amorphous layer 3, and further creating the plurality of concave surfaces 401 by etching process across the silicon oxide layer 4. Each of the concave surfaces 401 is equivalent to a concave mirror such that a directly project light beam can be reflected by the concave surfaces 401. In the preferred embodiment, the thickness of the silicon oxide layer 4 is about 300 nm. As shown in FIG. 2, the plurality of concave surfaces 401 are arranged across the silicon oxide layer 4, wherein each of the concave surfaces 401 has a circular shape with a diameter of 20 micro meters, and a depth of 150 nano meters. It should be noted that the depth mentioned here is referred to a vertical distance between the lowest point to a top surface of the silicon oxide layer 4. Distance between every two concave surfaces 401 is 450 micrometers. According to another preferred embodiment, the thickness of the silicon oxide layer 4 ranges from 280~350 nano meters, and the diameter of each of the concave surfaces 401 ranges between 10~20 micro meters, and the depth of each of the concave surfaces 401 ranges from 150~200 nano meters. The distance between every two adjacent concave surfaces 401 ranges between 300~600 micrometers.

(d) As shown in FIG. 1e, an excimer laser beam 5 is projected toward the amorphous silicon layer 3 through the silicon oxide layer 4 to transform the amorphous silicon layer 3 into the low temperature poly-silicon thin film. When the excimer laser beam 5 is projected onto the silicon oxide layer 4, the excimer laser beam 5 will be reflected when it hits onto the plurality of concave surfaces 401. As a result, the amorphous silicon layer 3 under the concave surfaces 401 of the silicon oxide layer 4 has a comparable low temperature, and therefore creating a low temperature area 301. While to the area other than the concave surfaces 401, the excimer laser beam 5 passes directly through the silicon oxide layer 4 so as to create a high temperature area 302 on the amorphous silicon layer 3. The poly-silicon crystallization grows from low energy to high energy, creating crystallization from low temperature to high temperature. Accordingly, as shown in the preferred embodiment of FIG. 3, when a recrystallization process occurs, the low temperature area 301 becomes a starting point of crystallization of the grain 6, and then expands and grows toward the high temperature area 302, as marked by arrow in FIG. 3. By this arrangement, a low temperature poly-silicon layer with larger amorphous silicon grain size, and controllable direction can be attained.

(e) After the amorphous silicon thin layer 3 completes its crystallization, the silicon oxide layer 4 is removed, not shown in Figure. The removal process can be conducted by etching process.

The low temperature poly-silicon layer made by the method described above features high electron migrating rate as well as excellent characteristic. It can be used in making thin film transistor, specially the thin-film-transistor used in the TFT array of the liquid crystal display. A low temperature poly-silicon thin film transistor made from the present invention will be described, and the transistor includes a substrate, a semiconductor layer, a gate insulative layer, a gate, a dielectric layer, a source and a drain. Wherein A semiconductor layer is deposited onto the substrate and which is configured by low temperature poly-silicon thin film, wherein the semiconductor includes a source, a drain, and a channel located between the source and drain; a gate insulative layer and gate being formed onto the semiconductor, wherein the insulative layer is used to isolate the gate and the semiconductor, and the gate is located in a position corresponding to the channel; a dielectric layer disposed onto the gate insulative layer and the gate, wherein the dielectric layer includes a first hole in which a source electrode is interconnected with the source, and a second hole in which a drain electrode is interconnected with the drain.

By utilizing the transistor array made from the low temperature poly-silicon layer provided by the present invention in liquid crystal display, the transistor features high electron migrating rate as well as excellent characteristic. It upgrades the displaying quality of the liquid crystal display.

In conclusion, the method for making low temperature poly-silicon thin film provided by the present invention is to grow a silicon oxide layer having a plurality of concave surfaces; then projecting excimer laser beam toward it to recrystallize the amorphous silicon layer, the excimer laser beam is reflected across the concave surfaces area. As a result, the amorphous silicon layer under the concave surfaces of the silicon oxide layer has a comparable low temperature, and therefore creating a low temperature area. While to the area other than the concave surfaces, the excimer laser beam passes directly through the silicon oxide layer so as to create a high temperature area on the amorphous silicon layer. The poly-silicon crystallization grows from low energy to high energy, creating crystallization from low temperature to high temperature. Accordingly, the low temperature area becomes a starting point of crystallization, and then expands and grows toward the high temperature area. By this arrangement, a low temperature poly-silicon layer with larger amorphous silicon grain size, and controllable direction can be attained. In addition, the transistor made from the low temperature poly-silicon layer features high electron migrating rate as well as excellent characteristic.

It should be noted that in the present invention, the terms of "first" and "second" are merely used to describe the operation of one embodiment over another embodiment, while does not impose any limitations to the substantial differences or operational relationships or orders between the embodiments explicitly or implicitly. Moreover, the term "comprising", "including" or any other variants thereof are intended to cover a non-exclusive inclusion, such that a number of elements including the process, method, article, or device including not only those elements, but also not explicitly listed other elements, or also for such process, method, article, or those elements inherent device. In the case where no more restrictions, by the statement "includes a . . . " qualified elements, including the said element does not exclude a process, method, article or device is also the same as the other elements present.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

The invention claimed is:

1. A method for making a low temperature poly-silicon thin film, including a step of growing amorphous silicon layer, a step of firstly growing a layer of silicon oxide over the amorphous silicon layer; then forming a plurality of concave surfaces across the silicon oxide layer, wherein the concave surfaces will reflect light beams vertically projected toward the silicon oxide; and finally, a step of projecting excimer laser beam toward the amorphous silicon layer through the silicon oxide layer to transform the amorphous silicon layer into a low temperature poly-silicon thin film;

wherein the method comprises the following steps:
(a) providing a substrate on which a buffer layer is arranged;
(b) creating the amorphous silicon layer on the buffer layer and then subjecting the amorphous silicon layer to a process of high temperature hydrogen embrittlement relief;
(c) creating the silicon oxide layer on the amorphous layer and further creating the plurality of concave surfaces by an etching process; and
(d) projecting excimer laser beam toward the amorphous silicon layer through the silicon oxide layer to transform the amorphous silicon layer into the low temperature poly-silicon thin film.

2. The method for making the low temperature poly-silicon thin film as recited in claim 1, further comprising a step of removing the silicon oxide layer after the low temperature poly-silicon layer is formed.

3. The method for making the low temperature poly-silicon thin film as recited in claim 1, wherein the concave surfaces are arranged in array over the silicon oxide lay.

4. The method for making the low temperature poly-silicon thin film as recited in claim 3, wherein a distance between two adjacent concave surfaces are 300~600 micrometers.

5. The method for making the low temperature poly-silicon thin film as recited in claim 4, wherein each of the concave surfaces includes a circular circumference with a diameter of 10~20 micrometers and a depth of 150~200 nano meters.

6. The method for making the low temperature poly-silicon thin film as recited in claim 1, wherein the buffer layer is made of silicon oxide.

7. A low temperature poly-silicon thin film, wherein a method for making the low temperature poly-silicon thin film includes the steps of:

growing an amorphous silicon layer and growing a layer of silicon oxide over the amorphous silicon layer;
forming a plurality of concave surfaces across the silicon oxide layer, wherein the concave surfaces will reflect light beams vertically projected toward the silicon oxide; and
projecting excimer laser beam toward the amorphous silicon layer through the silicon oxide layer to transform the amorphous silicon layer into the low temperature poly-silicon thin film;

wherein the method comprises the following steps:
(a) providing a substrate on which a buffer layer is arranged;
(b) creating the amorphous silicon layer on the buffer layer and then subjecting the amorphous silicon layer to a process of high temperature hydrogen embrittlement relief;
(c) creating the silicon oxide layer on the amorphous layer and further creating the plurality of concave surfaces by an etching process; and
(d) projecting excimer laser beam toward the amorphous silicon layer through the silicon oxide layer to transform the amorphous silicon layer into the low temperature poly-silicon thin film.

8. The low temperature poly-silicon thin film as recited in claim 7, further comprising pa step of removing the silicon oxide layer after the low temperature poly-silicon layer is formed.

9. The low temperature poly-silicon thin film as recited in claim 7, wherein the concave surfaces are arranged in array over the silicon oxide layer.

10. The low temperature poly-silicon thin film as recited in claim 9, wherein a distance between two adjacent concave surfaces is 300~600 micrometers.

11. The low temperature poly-silicon thin film as recited in claim 10, wherein each of the concave surfaces includes a circular circumference with a diameter of 10~20 micrometers and a depth of 150~200 nano meters.

12. The low temperature poly-silicon thin film as recited in claim 7, wherein the buffer layer is made of silicon oxide.

13. A low temperature poly-silicon thin film transistor, including
  a substrate;
  a semiconductor layer deposited onto the substrate and formed of a low temperature poly-silicon thin film, wherein the semiconductor layer includes a source, a drain, and a channel located between the source and the drain;
  a gate insulative layer and a gate being formed onto the semiconductor, wherein the insulative layer isolates the gate and the semiconductor layer, and the gate is located in a position corresponding to the channel;
  a dielectric layer disposed onto the gate insulative layer and the gate, wherein the dielectric layer includes a first hole in which a source electrode is interconnected with the source, and a second hole in which a drain electrode is interconnected with the drain; wherein
  the low temperature poly-silicon thin film is made by a method including the steps of:
  growing an amorphous silicon layer and growing a layer of silicon oxide over the amorphous silicon layer;
  forming a plurality of concave surfaces across the silicon oxide layer, wherein the concave surfaces will reflect light beams vertically projected toward the silicon oxide; and
  projecting excimer laser beam toward the amorphous silicon layer through the silicon oxide layer to transform the amorphous silicon layer into the low temperature poly-silicon thin film;
  wherein the method includes the following steps:
  (a) providing a substrate on which a buffer layer is arranged;
  (b) creating the amorphous silicon on the buffer layer;
  (c) creating the silicon oxide on the amorphous layer, and further creating the plurality of concave surfaces by an etching process; and
  (d) projecting excimer laser beam toward the amorphous silicon layer through the silicon oxide layer to transform the amorphous silicon layer into the low temperature poly-silicon thin film; and
  wherein the method further comprises the following steps:
  performing a process of high temperature hydrogen embrittlement relief to the amorphous silicon layer after the amorphous silicon layer is created; and
  removing the silicon oxide layer after the low temperature poly-silicon thin film is created.

14. The low temperature poly-silicon thin film transistor as recited in claim 13, wherein the concave surfaces are arranged in array over the silicon oxide layer; wherein each of the concave surfaces includes a circular circumference with a diameter of 10~20 micrometers and a depth of 150~200 nano meters; and wherein a distance between two adjacent concave surfaces is 300~600 micrometers.

* * * * *